United States Patent [19]
Klinedinst et al.

[11] Patent Number: 5,492,724
[45] Date of Patent: Feb. 20, 1996

[54] METHOD FOR THE CONTROLLED DELIVERY OF VAPORIZED CHEMICAL PRECURSOR TO AN LPCVD REACTOR

[75] Inventors: Keith A. Klinedinst, Marlborough; Joseph E. Lester, Lincoln, both of Mass.

[73] Assignee: Osram Sylvania Inc., Danvers, Mass.

[21] Appl. No.: 199,914

[22] Filed: Feb. 22, 1994

[51] Int. Cl.⁶ .................................................. C23C 16/02
[52] U.S. Cl. ........................................ 427/248.1; 118/726
[58] Field of Search ............................ 427/248.1, 255.1; 118/715, 726

[56] References Cited

U.S. PATENT DOCUMENTS

| | | | |
|---|---|---|---|
| 4,708,884 | 11/1987 | Chandross et al. | 427/579 |
| 5,203,925 | 4/1993 | Shibuya et al. | 118/724 |
| 5,232,869 | 8/1993 | Frigo et al. | 427/124 |
| 5,314,727 | 5/1994 | McCormick et al. | 427/252 |
| 5,316,579 | 5/1994 | McMillan et al. | 427/226 |

FOREIGN PATENT DOCUMENTS

WO90/12900 11/1990 WIPO ................... 118/726

*Primary Examiner*—Terry J. Owens
*Attorney, Agent, or Firm*—Carlo S. Bessone

[57] ABSTRACT

Method and apparatus for the controlled delivery of vaporized chemical precursor to a low pressure chemical vapor deposition (LPCVD) reactor. A flow of liquid precursor containing dissolved inert gas is passed through a restrictor element. The dissolved inert gas is released from the liquid precursor at or near the downstream side of the restrictor element. The inert gas is separated from the liquid precursor, thereby producing a continuous flow of liquid precursor, and this flow is fed into an inlet of a-vaporizer. The vaporized precursor is delivered into an LPCVD reactor.

4 Claims, 5 Drawing Sheets

METHOD FOR THE CONTROLLED DELIVERY OF VAPORIZED CHEMICAL PRECURSOR TO AN LPCVD REACTOR

FIELD OF THE INVENTION

This invention relates in general to low-pressure chemical vapor deposition (LPCVD) reactors and pertains, more particularly, to an apparatus and method for the controlled delivery of a chemical precursor to such reactors.

BACKGROUND OF THE INVENTION

Low-pressure chemical vapor deposition (LPCVD) reactors are widely used in the manufacture of thin-film devices such as those employed in microelectronic circuitry or in wavelength-selective optical filters. The utilities of such devices frequently depend upon the precision and predictability of their responses to varying inputs. Such responses, in turn, frequently depend critically upon the thicknesses, compositions, and physical properties of the various material thin films of which they are composed. To achieve the required control of thin film chemical and physical properties, the LPCVD processes by which these multilayer devices are manufactured must themselves be carried out under precise control. Further, in order to minimize waste in practical LPCVD manufacturing processes, unpredictable run-to-run variations must be minimized or eliminated. This, in turn, requires that the LPCVD processes be carried out with strict control of the key operating parameters which include, in addition to reactor temperature and pressure, the rates at which the vaporized chemical precursors, oxidants, inert diluents, and other gaseous components are delivered to the operating reactor.

Precise control of the delivery rates of gaseous oxidants (e.g., $O_2$ or $N_2O$) or of inert diluents (e.g., $N_2$ or Ar) may be achieved quite easily by the use of so-called mass flow controllers which are widely available from a number of commercial sources. Similarly, there are commercially available flow controllers that are designed to deliver various vaporized chemical precursors at controlled rates to the inlet ports of LPCVD reactors. Generally, such chemical precursors are liquids at normal temperatures and pressures. Two distinctly different operations must be carried out so as to achieve a controlled vapor delivery rate—namely, vaporization and flow control. However, these two operations need not be performed in any particular order. Therefore, a gas flow controller may be employed downstream of a liquid vaporizer, or a vaporizer may be employed downstream of a liquid flow controller. Both approaches have been used, and the selection of the approach to be used with a particular precursor is typically based upon a consideration of the chemical and physical properties of the material—most particularly, the so-called vapor pressure curve (equilibrium vapor pressure as a function of temperature), the thermal stability of the material (tendency to thermally decompose as a function of temperature), and sensitivity to the presence of impurities (tendency to react at elevated temperatures with impurities and the effects of such impurities and their reaction products).

A liquid flow controller followed by a downstream vaporizer is most typically employed (and may be required) in cases where relatively high temperatures are required to achieve practical precursor vapor pressures (typically on the order of 5–10 mm Hg), with precursors which have relatively low thermal stabilities, or with precursors which may react detrimentally with impurity molecules (e.g., $H_2O$) which might find their way into an evacuated container of the heated precursor. An example of a precursor for which a liquid mass flow controller is, for all these reasons, most desirable is tantalum ethoxide $((Ta(OEt)_5)_2)$, the reactive precursor most often used in LPCVD processes for the deposition of $Ta_2O_5$ thin films.

Perhaps the simplest of liquid flow controllers are those which are basically pumping devices. Included in this category are syringe pumps wherein the movement of a stepper motor is translated into pressure upon the sliding plunger of a liquid-filled syringe. Also included are various other devices such as peristaltic pumps wherein the movement of a rotating shaft translates into the alternate filling and emptying of compartments. The liquid stream exiting from such pumps frequently oscillates or pulsates in velocity, reflecting the alternating mechanical motion by which it is forced through the device. Materials compatibility problems are also frequently encountered, particularly with polymeric seals which tend to adsorb and/or react with the pumped liquid, or which simply wear and eventually leak.

Another class of liquid flow control devices which are used in conjunction with downstream vaporizers are those usually referred to as liquid mass flow controllers (MFC's). By analogy with the more widely used gas MFC's, these devices employ some sort of electronic flow sensing elements along with constant diameter tubing, tuning circuitry, and a feedback loop which operates in conjunction with an electromechanical control valve. Thermal sensors are typically employed, along with heating or cooling devices by which heat is added or removed from the flowing liquid. The measured temperature difference is assumed proportional to both the mass flow and the specific heat of the liquid. Such liquid MFC's are highly sophisticated and relatively complex pieces of equipment with multiple sources of error and possible breakdown points. They must be designed and calibrated for a specific liquid in a specific flow velocity range, and they are only accurate within that relatively narrow range. They typically contain a number of polymeric seals which may begin to leak as a result of absorption or reaction with the flowing liquid, or simply as the result of normal aging and loss of elasticity.

There is, however, another approach to liquid flow control which is, in principle, much simpler than either of the general methods described above. In this simpler approach, a pressure drop is applied across a high-resistance flow control element which might conceptually be nothing more than a tiny orifice or a relatively long length of capillary-bore tubing. The liquid precursor might be contained within a reservoir located upstream of the flow control element. The liquid vaporizer would be positioned downstream of the flow control element between the flow control element and the inlet to the LPCVD reactor.

Unfortunately, there are some basic problems with this approach which, until now, have made it virtually impossible to achieve controlled liquid delivery rates by its use. The first problem derives from the fact that, depending upon the reactor conditions required to carry out a given thin-film deposition process, it may be necessary to deliver the liquid precursor at a very low rate—e.g., a small fraction of a cubic centimeter per minute. Thus, the liquid flow control element must be scaled so as to cause the pressurized liquid to flow through it at very low rates. If an orifice (e.g., a small hole drilled through a metal plate) were employed as the flow control element, the orifice would have to be on the order of 10 microns in diameter. Or, if a length of capillary-bore tubing were used as the flow control device, its length would have to be on the order of 8 feet if its diameter were no more than 10 mils. With dimensions of this type, it is very likely that the flow control device would eventually and unpredictably become partially or completely blocked by small solid particles that somehow find their way into the liquid stream.

A second problem with the attempt to use a pressure drop across a high resistance flow control element to achieve precisely controlled liquid precursor delivery rates derives from the uncontrolled release of dissolved gas on the downstream (low pressure) side of the flow control element. The simplest way to apply a continuously adjustable pressure to the surface of a column of liquid is by the use of a pressurized gas—e.g., by the use of a pressure regulator in conjunction with a source of compressed $N_2$ or Ar gas. Some of the pressurized gas dissolves within the liquid, the amount of gas dissolved in a particular liquid being determined by the gas solubility at the selected pressure and liquid temperature. Now, since the pressure on the downstream side of the flow control element is much lower than on the upstream side (indeed, compared with the upstream pressure, which may be as high as several atmospheres, the downstream side of the flow control element is practically evacuated), the dissolved gas comes out of solution, forming bubbles of gas distributed randomly within the liquid stream. This process is exactly analogous to the formation of gas bubbles when a bottle of carbonated liquid is first opened. flowing through fairly narrow diameter tubing on its way to the downstream vaporizer then becomes discontinuous as the small gas bubbles combine to form larger ones. Now, the delivery of a constant velocity gas stream from the output of the vaporizer to the inlet of the LPCVD reactor depends upon the delivery of a constant velocity liquid stream from the outlet of the flow controller to the inlet of the vaporizer. The presence of the randomly distributed gas bubbles within the liquid stream, therefore, will cause very large and unpredictable variations in the rate at which the vaporized precursor is delivered to the LPCVD reactor—exactly the opposite of the precisely controlled gas velocity that is required to achieve precise control over the thin film deposition process being carried out within the reactor.

Assuming that this entrained gas bubble problem could be solved, there is yet a third problem with the attempt to use a pressure drop across a high resistance flow control element to achieve precisely controlled liquid precursor delivery to a downstream vaporizer. This problem relates to the difficulty of vaporizing the liquid rapidly and completely such that the vaporized precursor exits the vaporizer at a constant rate that is exactly equivalent to the rate at which the liquid precursor passes through the upstream flow control element. To accomplish this, the slowly moving liquid stream which passes through a fairly narrow diameter tube connecting the downstream side of the flow control element to the upstream side of the vaporizer must drain continuously into the high temperature zone of the vaporizer without forming droplets at the end of the delivery tube and without being held up in relatively low or intermediate temperature portions of the vaporizer—phenomena which typically arise as a result of surface tension and relative wetability effects and which are accentuated by the very low liquid velocities that may be required to achieve the thin-film deposition rates desired in a particular LPCVD reactor process.

Solutions to all of the problems outlined above are contained within the novel apparatus and method for the controlled delivery of vaporized chemical precursor to an LPCVD reactor that are described below.

SUMMARY OF THE INVENTION

It is, therefore, an object of the present invention to obviate the disadvantages of the prior art.

It is another object of the invention to provide an uninterrupted constant velocity flow of liquid precursor to a liquid vaporizer.

It is still another object of the invention to provide a precise control of the rate at which vaporized chemical precursor is delivered to a reactor.

It is yet another object of the invention to provide an improved liquid flow controller which is relatively simple in design.

It is a further object of the invention to provide a liquid flow controller which operates effectively at a very low rate.

These objects are accomplished in one aspect of the invention by the provision of an apparatus for the controlled delivery of a vaporized chemical precursor to an LPCVD reactor. The apparatus comprises a container of liquid precursor pressurized by a source of inert gas and a flow restrictor element for restricting a flow of liquid precursor, which contains a quantity of dissolved inert gas, from the container of liquid precursor. A gas/liquid phase separator is coupled to the flow restrictor element for separating the quantity of dissolved inert gas from the flow of liquid precursor and for producing a continuous flow of liquid precursor. An input of a liquid vaporizer is coupled to the gas/liquid phase separator for receiving the continuous flow of liquid precursor and for producing a quantity of vaporized precursor. The vaporized precursor within the liquid vaporizer is coupled to an LPCVD reactor.

In accordance with further teachings of the present invention, the flow restrictor element has a small internal volume and a relatively large minimum passage diameter.

In accordance with further aspects of the present invention, gas/liquid phase separator comprises a second source of inert gas. Preferably, this second source of inert gas is coupled between an output of the liquid flow restrictor and the input of the liquid vaporizer.

In accordance with still further aspects of the present invention, the liquid vaporizer comprises a housing containing a high temperature element. Preferably, the liquid vaporizer is coupled to the flow restrictor element by a gas/liquid delivery conduit. One end of the conduit within the housing is connected to the high temperature element by means of fine metallic filaments.

In accordance with still further aspects of the present invention, the above objects are accomplished by the provision of an improved method for the controlled delivery of a vaporized chemical precursor to an LPCVD reactor.

Additional objects, advantages and novel features of the invention will be set forth in the description which follows, and in part will become apparent to those skilled in the art upon examination of the following or may be learned by practice of the invention. The aforementioned objects and advantages of the invention may be realized and attained by means of the instrumentalities and combination particularly pointed out in the appended claims.

BRIEF DESCRIPTION OF THE DRAWINGS

The invention will become more readily apparent from the following exemplary description in connection with the accompanying drawings, wherein.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
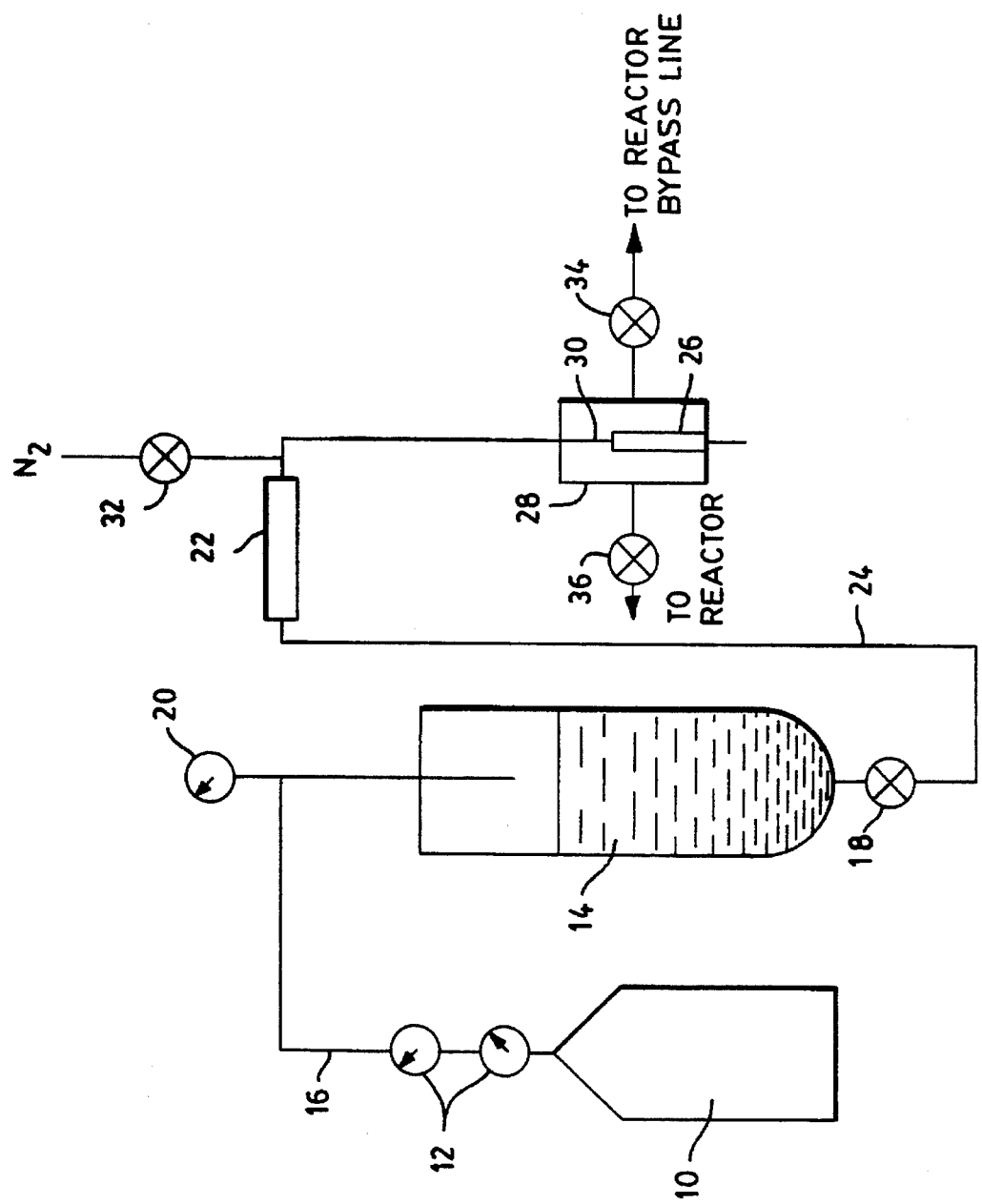
FIG. 1 represents a schematic of an apparatus for the controlled delivery of vaporized chemical precursor to an LPCVD reactor according to the present invention.

Referring to the drawings, FIG. 1 illustrates a schematic of an apparatus for the controlled delivery of vaporized chemical precursor to an LPCVD reactor. The apparatus includes a source of a compressed inert gas 10 such as $N_2$ or Ar fitted with appropriate gas pressure regulators 12, a container of liquid LPCVD precursor 14 equipped with a downstream shutoff valve 18 and connected to the pressurized inert gas source 10 via a high pressure gas-filled line 16 fitted with a gauged pressure transducer 20, and a liquid flow restrictor 22 connected to the container of pressurized liquid LPCVD precursor 14 via a high pressure liquid-filled line 24. The downstream side of the liquid flow restrictor is linked to the high temperature element 26 of a liquid vaporizer 28 via a length of metal tubing 30. The liquid precursor flowing through this length of tubing 30 is combined with a quantity of inert gas (e.g., $N_2$ or Ar) which enters the liquid-containing tubing 30 through a flow-control valve 32 just downstream of the liquid flow restrictor 22. Separate valves 34 and 36 direct the vaporized precursor either into a heated line leading to the LPCVD reactor or into an LPCVD reactor bypass line connecting directly to the downstream pumping system (not shown).

In practice, the gas pressure regulators 12 are adjusted so as to apply a specific inert gas pressure, through the high pressure gas line 16, to the surface of the liquid precursor within the sealed pressure vessel 14. A calibrated gas pressure transducer and gauge 20 are employed to obtain an accurate measurement of the inert gas pressure. As a result, the pressurized liquid is forced through the downstream flow restrictor 22 at a rate that is determined by the design of the flow restrictor, as well as by the applied pressure and the physical properties of the liquid (i.e., viscosity) Since the downstream side of the flow restrictor is evacuated, the applied pressure is practically numerically equivalent to the pressure drop across the flow restrictor if one assumes negligible flow resistance in the liquid-filled line upstream of the restrictor 24. The flow restrictor is designed with minimum internal volume in order that the entire pressure drop occur across a relatively small liquid volume and that the 'residence time' of the liquid within the flow restrictor element will be as short as possible so that the evolution of any dissolved inert gas occurs at or near to the low pressure side of the restrictor.

The liquid exiting the flow restrictor 22, along with any evolved gas, then drains into the downstream liquid vaporizer through a short section of tubing 30, the end of which is positioned close to the high temperature vaporizer element 26. Metallic filaments (e.g., sections of thin nickel or stainless steel wire) are employed to bridge the gap between the end of the delivery tube and the high temperature vaporizing element so that the liquid exiting from the delivery tube flows continuously onto the heating element rather than forming droplets at the end of the delivery tube. The formation of bubbles of inert gas within the stream of liquid precursor exiting the downstream side of the flow restrictor is prevented by completely separating the liquid and gaseous phases near to the downstream side of the restrictor. This is accomplished by the deliberate injection of a constant velocity stream of inert gas (e.g., $N_2$ or Ar) just downstream of the flow restrictor. The constant velocity stream of inert gas combines with any inert gas which may have been dissolved within the pressurized liquid. The net result is that two continuous fluid streams feed into the liquid vaporizer—one, a stream of liquid precursor which drains down the filamentary structure connecting the end of the delivery tube with the high temperature vaporizing element, and the other a stream of inert gas which is pumped through the vaporizer and into the LPCVD reactor or reactor bypass line, effectively diluting the stream of vaporized precursor. Further dilution of the vaporized precursor stream may be achieved either by increasing the flow of inert gas into the liquid delivery tube just downstream of the flow restrictor, or be injecting an additional quantity of inert gas directly into the high temperature vaporizer. Two vaporizer outlet valves may be employed so as to direct the diluted precursor gas stream, through heated lines, either into the LPCVD reactor or directly into the downstream trapping/pumping system thereby bypassing the reactor.

The following examples are provided to further illustrate the operation and effectiveness of this new method for the controlled delivery of vaporized chemical precursor to an LPCVD reactor. The first example deals with the controlled delivery of a liquid precursor, at ambient temperature, through a flow restrictor characterized by a small internal volume and a relatively large minimum passage diameter coupled with an efficient downstream gas/liquid separator. The second example illustrates the precise control of the LPCVD thin film deposition process obtained when the two continuous fluid streams exiting from the gas/liquid separator are properly linked with an efficient downstream liquid vaporizer, the output of which is fed into the gas inlet of a hot-wall LPCVD reactor. In these examples, tantalum pentaethoxide $(Ta(OEt)_5)_2$ is employed as the liquid precursor which reacts within an LPCVD reactor to form thin film tantalum oxide $(Ta_2O_5)$.

EXAMPLE 1

In a typical but non-limitative example of the present invention, a 950,000 Lohm Viscojet flow restrictor manufactured by the Lee Co., Westport, Connecticut was employed. The control element of the Viscojet consists of a series of chambered discs sandwiched together to form a complex fluid passage. The liquid volume contained within the stack of sandwiched discs is a small fraction of a cubic centimeter such as on the order of $10^{-2}$ cc. Thus, the residence time of the liquid precursor within the flow restrictor is relatively small such on the order of seconds, even for liquid flow rates as low as a fraction of a cubic centimeter per minute. On the other hand, there is a 5 mil minimum passage diameter within the stack of chambered discs, an order of magnitude larger than the diameter of the single orifice that would be required to produce an equivalent flow resistance. The small internal volume and relatively large minimum passage diameter combine to greatly reduce the chances of flow restrictor clogging due to the entrapment of small solid particles that might somehow find their way into the liquid stream. The small volume of liquid contained within the flow restrictor element and the resulting short liquid residence times also minimize the possibility of gas bubble formation within and towards the downstream (low pressure) side of the flow restrictor due to the evolution of gas which dissolves within the liquid on the high pressure side of the flow restrictor.

The downstream side of the stainless steel flow restrictor housing was linked with a short length of ⅛ inch diameter stainless steel tubing via a stainless steel compression fitting. This section of tubing functions as a conduit for the stream of liquid and inert gas exiting the downstream side of the flow restrictor. A second length of ⅛ inch diameter tubing branched into this first section of tubing near to the downstream opening of the flow restrictor, again via a stainless steel compression fitting. This second section of tubing functions as a conduit for a metered stream of $N_2$ or other inert gas the purpose of which is to effect complete separation of the liquid and gaseous phases within the ⅛ inch diameter tubing which leads directly from the downstream side of the restrictor. Finally, the end of the ⅛ inch stainless steel tubing carrying the separated streams of liquid precursor and inert gas was attached to the inlet of a standard Pyrex cold trap, the outlet of which was continuously evacuated via a standard mechanical vacuum pump.

The liquid precursor $((Ta(OEt)_5)_2)$ was contained within a stainless steel pressure vessel. The bottom of the vessel was fitted with a valve and a length of stainless steel tubing which also connected to the upstream side of the flow restrictor housing, again via stainless steel compression fittings. The surface of the column of liquid precursor contained within the pressure vessel was pressurized with $N_2$ or other inert gas so as to force the liquid which contains dissolved inert gas through the flow restrictor and into the gas/liquid phase separator. A gauged pressure transducer and sensitive gas pressure regulator were used to monitor and control the pressure of inert gas applied to the column of liquid precursor contained within the pressure vessel.

A series of tests were carried out to evaluate the effectiveness of this apparatus as a means of achieving the precisely controlled delivery of a liquid precursor into an evacuated chamber such as a liquid vaporizer linked to a downstream LPCVD reactor, or simply an evacuated liquid trap as described above. In a typical run, a cleaned and preweighed liquid trap was attached to the end of the ⅛ inch diameter stainless steel tubing and evacuated. The gas pressure regulator was adjusted so as to apply a preselected pressure of inert gas to the surface of the liquid precursor contained within the pressure vessel. Using a standard gas-phase mass flow controller, a 10 sccm flow of purified $N_2$ gas was established into the ⅛" diameter line just downstream of the Viscojet flow controller. Finally, a valve was opened allowing the pressurized liquid to pass through the flow restrictor and into the section of ⅛ inch diameter tubing where gas evolution occurred and where the evolved gas combined with the 10 sccm flow of purified $N_2$ to effect a complete separation of the gas and liquid phases. The two fluid streams passed through the ⅛ inch diameter tubing into the trap. The liquid precursor remained in the trap, while the gas was removed through the vacuum pump attached to the downstream side of the liquid trap. After a predetermined length of time, the liquid flow was stopped, and the trap was disconnected and reweighed to determine the quantity of liquid precursor collected. The liquid weight was divided by its density and the length of the run to obtain the liquid flow rate cc/min). A series of tests were carried out with different applied inert gas pressures so as to determine the relationship between applied pressure and liquid precursor delivery rate.

Figure 2:
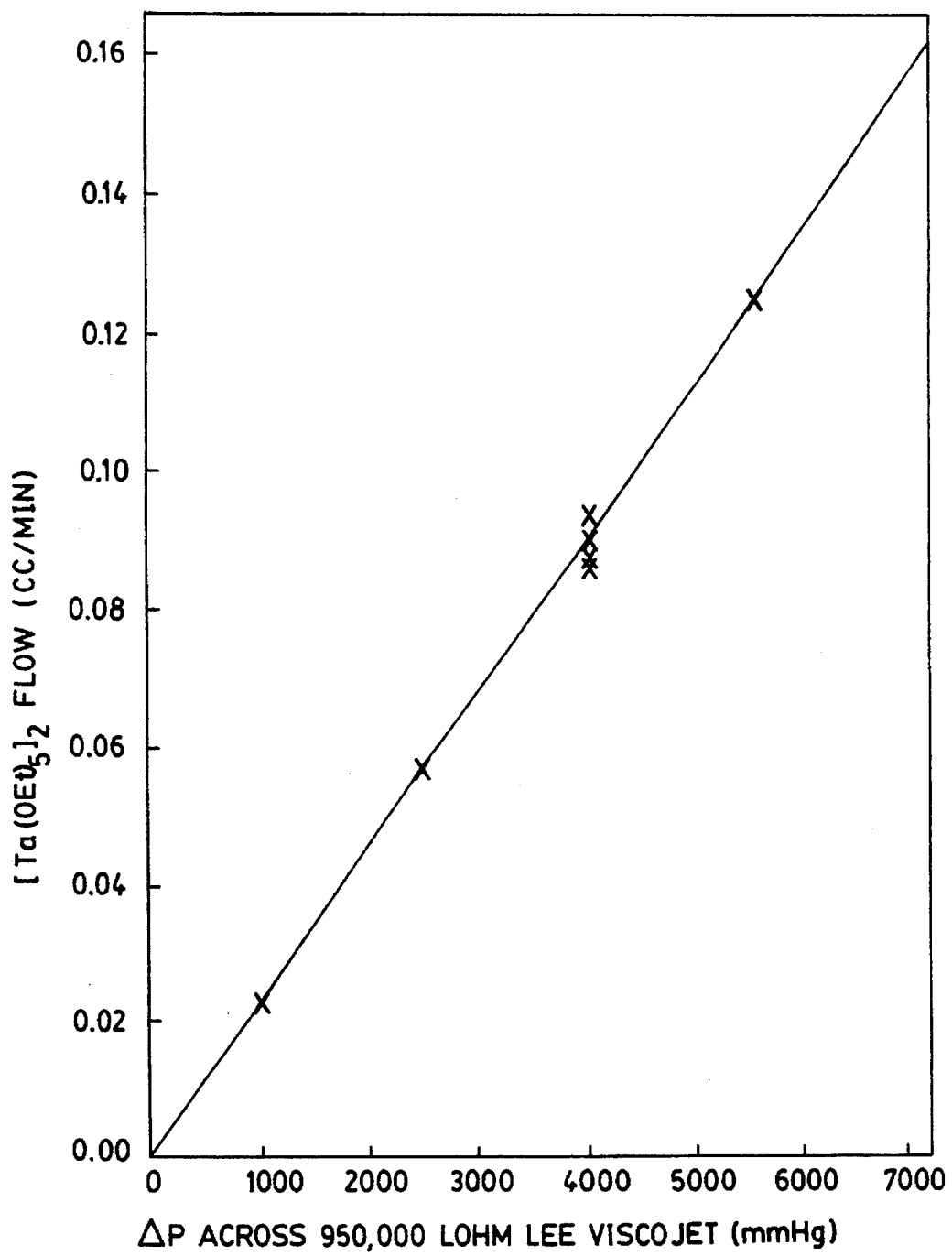
FIG. 2 is a plot of $(Ta(OEt)_5)_2$ flow (in cc/min) versus the ]pressure drop across the flow restrictor for a first of a series of tests.

The results of these tests are shown in FIG. 2 which contains a plot of $(Ta(OEt)_5)_2$ flow (in cc/min) versus the pressure drop across the flow restrictor. The agreement between the results of tests carried out with the same applied pressure, the linearity of the data, and the extrapolation to zero flow with zero pressure drop all testify to the precision of this liquid precursor flow control method.

Figure 3:
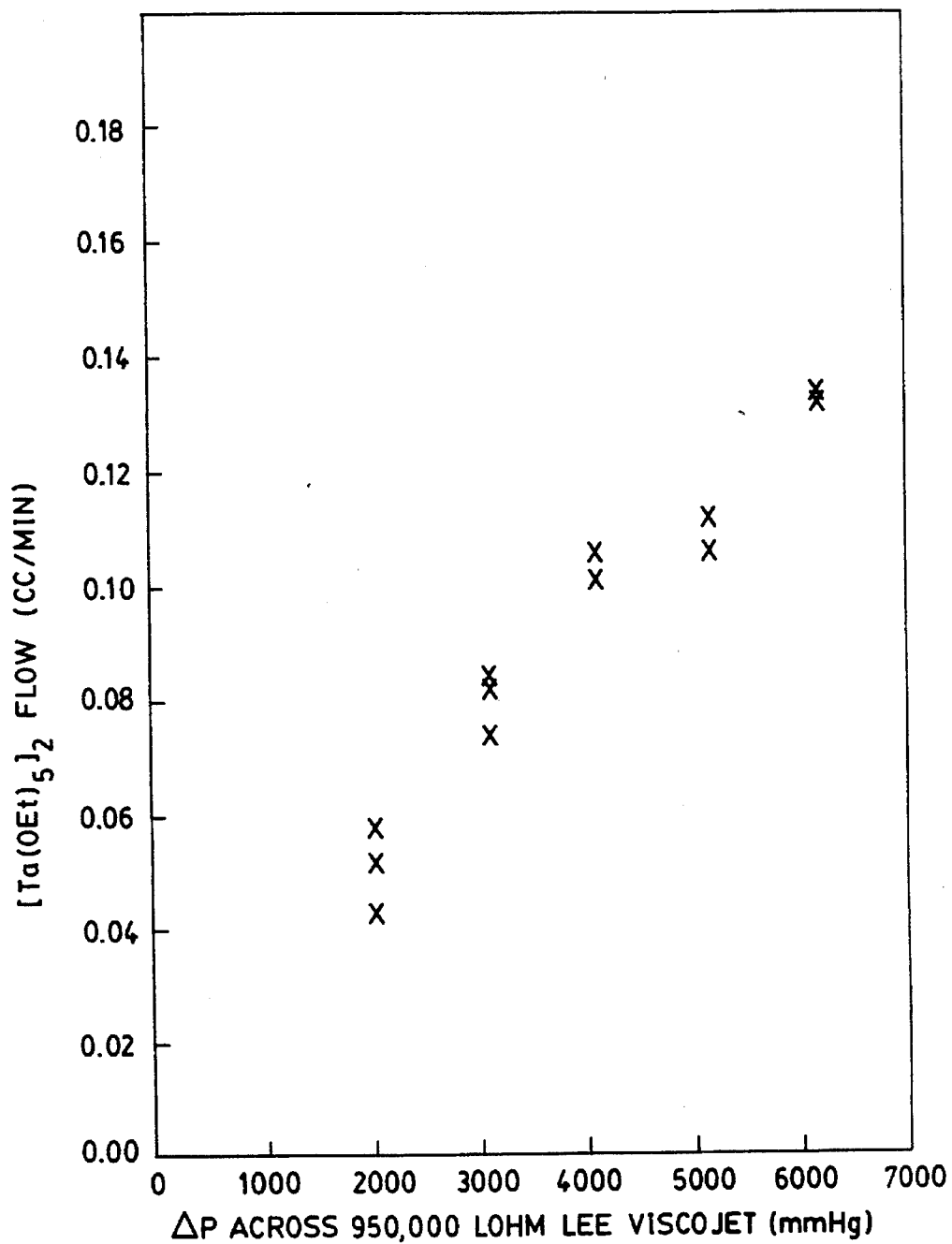
FIG. 3 is a plot of $(Ta(OEt)_5)_2$ flow (in cc/min) versus the 7pressure drop across the flow restrictor for a second of a series of tests.

Then, the flow of $N_2$ gas used to effect the separation of the liquid and gaseous phases within the conduit downstream of the flow restrictor was stopped, and a second series of tests were carried out with an otherwise identical procedure. The results of this second set of tests wherein $(Ta(OEt)_5)_2$ flow was measure as a function of the pressure drop across the flow restrictor are represented graphically in FIG. 3. The poor agreement between the results of tests carried out with the same applied pressure, the lack of any obvious functionality other than a broad trend towards higher rates of flow with increasing pressure drop, and the observed discontinuity of the liquid stream entering the trap that was observed during each test all testify to the effectiveness of the gas/liquid phase separation means employed in the first series of tests as well as the necessity of it if uniform and predictable liquid delivery rates are to be achieved.

EXAMPLE 2

In another non-limitative example of the present invention, the end of the ⅛ inch diameter liquid/gas delivery tube was then inserted into the stainless steel body of a liquid evaporator heated to about 220° C. via external heating elements. Several thin nickel wires of uniform length were spot welded to the end of the stainless steel delivery tube. The other end of each wire was attached to the internal surface of the evaporator which was also heated to about 220° C. via a separately controlled heating element. The body of the evaporator had two separate vacuum ports with high temperature vacuum valves leading through heated ½ inch diameter stainless steel lines to the gas inlet port of a downstream LPCVD reactor or directly to the trapping/pumping system which was located downstream of the reactor via a reactor bypass line. Thus, the output of the vaporizer could be switched rapidly from the reactor bypass line to the reactor line or vice versa without interrupting the flow of diluted vaporized precursor exiting from the vaporizer. In addition to being diluted via the $N_2$ or other inert gas evolved on the downstream side of the flow restrictor and via the additional flow of inert gas injected at a 10 sccm rate just downstream of the flow restrictor by which to effect the complete separation of the liquid and gaseous streams entering the downstream vaporizer, the precursor was further diluted by the injection of additional purified $N_2$ at a 20 sccm rate directly into the body of the high temperature vaporizer.

In addition, oxygen gas was metered into the base of the LPCVD reactor at a 40 sccm rate, and an additional quantity of purified nitrogen was injected so as to maintain a 105 sccm total gas flow rate into the base of the reactor during each run. Two-inch diameter silicon wafers spaced two inches apart were employed as deposition substrates. The substrate temperature was maintained at 450° C. via a four-zone clam-shell furnace. The reactor pressure was controlled at 0.5 Torr. The $(Ta(OEt)_5)_2$ precursor was forced through the 950,000 Lohm Viscojet flow restrictor using pressures of purified $N_2$ comparable to those employed in Example 1. To begin each run, the vaporized precursor delivery system was stabilized with the diluted $[Ta(OEt)_5]_2$ vapor pumped out of the evaporator through the reactor-bypass line. Then, to begin the deposition process, the high-temperature valve leading to the LPCVD rector was opened while simultaneously closing the corresponding valve leading directly to the trapping/pumping system. After a predetermined period of time, the run was ended by simply reversing the valve switching procedure. The thicknesses of the resulting $Ta_2O_5$ deposits were determined by ellipsometry.

Figure 4:
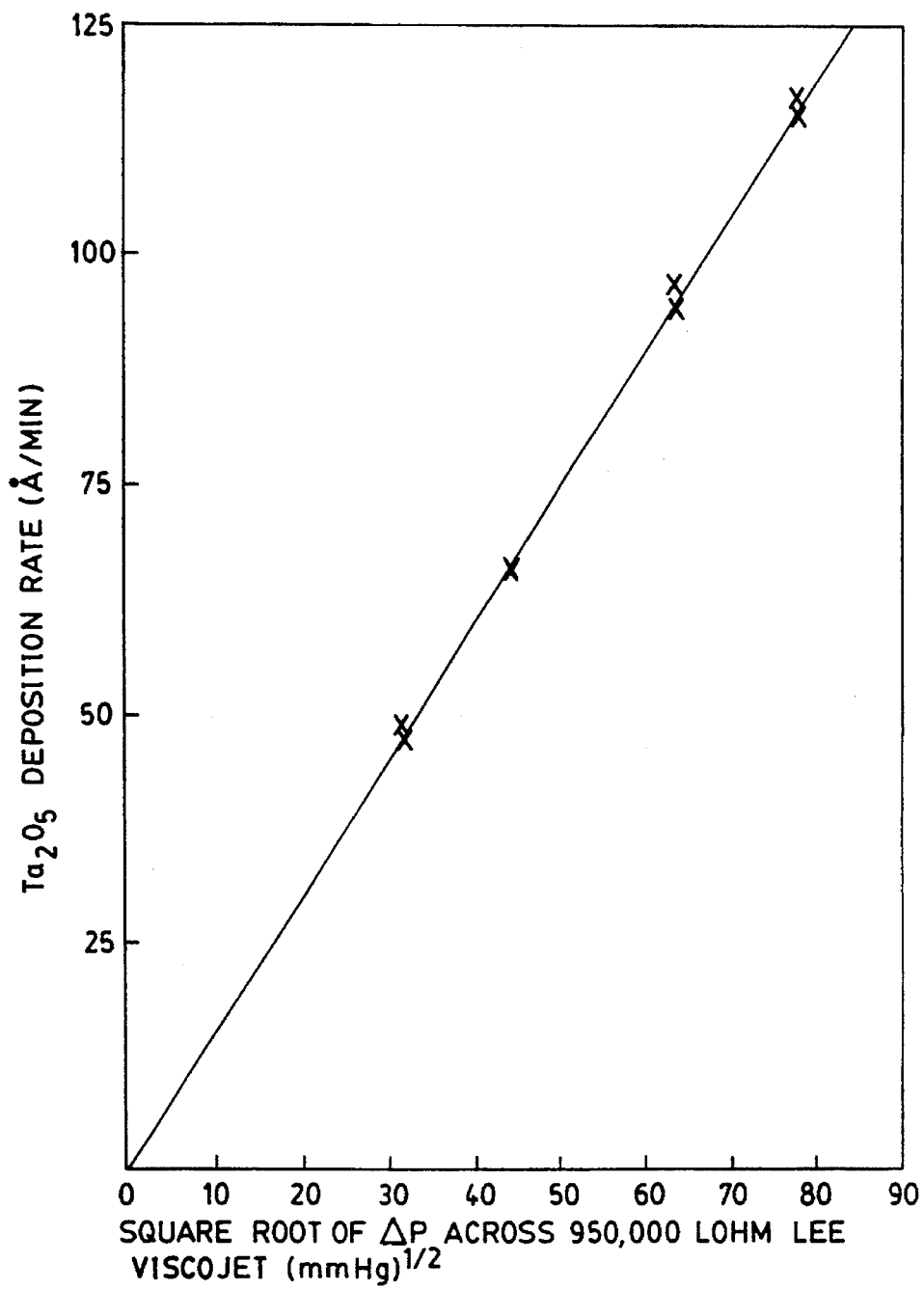
FIG. 4 is a plot of the measured $Ta_2O_5$ deposition rates obtained with the center substrate versus the square root of the pressure drop applied across the Viscojet flow restrictor for each of eight different tests.

In FIG. 4, the measured $Ta_2O_5$ deposition rates obtained with the center substrate are plotted versus the square root of the pressure drop applied across the Viscojet flow restrictor for each of eight different tests. The agreement between the results of tests carried out with the same applied pressure, the linearity of the data, and the extrapolation to zero reaction rate with zero pressure drop are all reflections of the precise control over the rate of delivery of the vaporized precursor to the downstream LPCVD reactor that was achieved using the procedure and apparatus described above.

Figure 5:
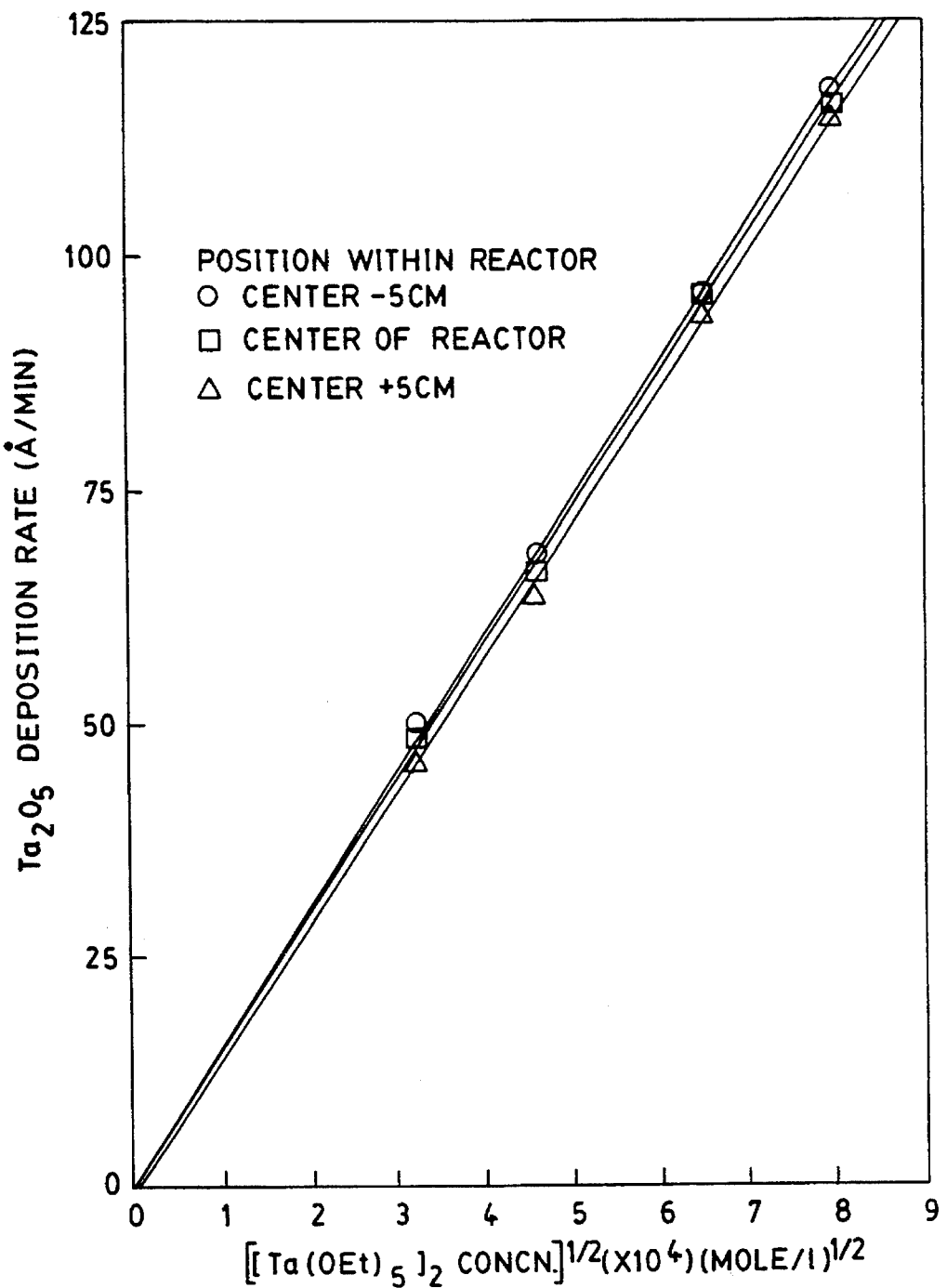
FIG. 5 is a plot of the deposition rates versus the square root of the nominal precursor concentration within the 450° C. hot-wall LPCVD reactor for three centermost substrates in one series of tests.

In FIG. 5 are plotted the deposition rate data obtained with substrates in one series of tests. However, in this case, the deposition rates are plotted versus the square root of the nominal precursor concentration within the 450° C. hot-wall LPCVD reactor calculated from the pressure and mass flow values employed in each test. Again, the linearity, zero extrapolation, and internal consistency demonstrated in FIG. 5 attest to the precision with which the delivery rate of the vaporized precursor is determined by means of a simple adjustment of the pressure of inert gas applied to the vessel containing the liquid precursor. The linearity and zero extrapolation shown in FIG. 5 also indicate that the rate determining process probably involves the reaction of adsorbed monomeric $Ta(OEt)_5$ formed via a preceding dissociative adsorption process.

For purposes of comparison, two additional deposition experiments were carried out with a $2 \times 10^{-7}$ mole/l nominal $(Ta(OEt)_5)_2$ concentration. However, in these tests, the 10 sccm flow of purified $N_2$ injected into the liquid delivery line just downstream of the flow restrictor was turned off. Center substrate deposition rates of 27.4 Angstrom/min and 43.3 Angstrom/min were obtained in these tests, the poor agreement reflecting the nonuniformity of the vaporized precursor delivery rate that was obtained with the gas/liquid separator turned off.

In general, vaporized chemical precursors must be delivered to the gas inlet ports of LPCVD reactors at very precisely controlled rates if it is required to achieve very precise control over the rates of thin film deposition processes carried out within such reactors. A liquid flow controller followed by a downstream vaporizer is preferred or may even be required in cases where relatively high temperatures are required to achieve practical p,recursor vapor pressures, with precursors which have relatively low thermal stabilities, or with precursors which may react detrimentally with impurity molecules which might find their way into an evacuated container of the heated precursor. Tantalum ethoxide $((Ta(OEt)_5)_2)$, the reactive precursor most often used in LPCVD processes for the deposition of $Ta_2O_5$ thin films, is one such material.

There are three different basic types of liquid flow control methods: 1) those which employ some type of mechanical pumping mechanism; 2) methods employing liquid mass flow controllers which operate via some sort of electronic flow sensing elements along with tuning circuitry and a feedback loop which operates in conjunction with an electromechanical control valve; and, 3) methods in which a pressure drop is applied across a high-resistance flow control element which might, in simplest form, be nothing more than a tiny orifice or a relatively long length of capillary-bore tubing. Unfortunately, each of these basic method types has its own set of characteristic problems and limitations. In the case of the third class of liquid flow controller listed above employing a pressure drop across a high-resistance flow control element, there are three key problems which, until now, have made it virtually impossible to achieve reliably and precisely controlled liquid delivery rates by its use, including: 1) the likelihood that the very small orifice or very long length of small diameter capillary tubing required to achieve very low liquid flow rates may become partially or completely blocked by small solid particles that somehow find their way into the liquid stream; 2) bubble formation on the downstream side of the flow control element resulting from the uncontrolled evolution of gas which dissolves in the liquid precursor on the upstream pressurized side of the flow restrictor; and, 3) the difficulty of transferring the slowly moving liquid stream continuously into the high temperature zone of the downstream liquid vaporizer without forming droplets at the end of the delivery tube and without being held up in relatively low or intermediate temperature portions of the vaporizer.

All of these problems are solved by the above-described apparatus and method for the controlled delivery of a vaporized chemical precursor to an LPCVD reactor. In accordance with the teachings of the invention, the apparatus preferably includes a flow restrictor element with a small internal volume but with a relatively large minimum passage diameter so as to a) minimize liquid residence time within the flow restrictor which minimizes the possibility of gas-bubble formation within and towards the low pressure side of the flow restrictor and b) minimize the chances of flow restrictor clogging. A gas/liquid phase separator consisting, e.g., of a metered stream of inert gas l,s coupled to the conduit carrying the mixture of liquid and evolved gas exiting from the downstream side of the flow restrictor. A source of pressurized inert gas forces the liquid precursor through the downstream flow restrictor. A liquid vaporizer coupled to the flow restrictor includes separate external and internal heating means, with fine metallic filaments connected both to the end of the gas/liquid delivery conduit which extends into the body of the vaporizer and to the surface of the internal heated vaporizer element so as to achieve uniform, uninterrupted flows both of liquid precursor from the delivery tube onto the high-temperature element internal to the vaporizer and of gas from the delivery conduit into and out of the vaporizer via the downstream pumping system.

The apparatus and method described above do not rely upon or require the use of liquid pumping equipment, electromechanical devices, electronic sensors or feedback loops, polymeric seals, or other failure prone elements such as very tiny flow restrictor orifices or long lengths of narrow-bore capillary tubing which are basic building blocks of the liquid flow control methods and devices known heretofore.

While there have been shown and described what are at present considered to be the preferred embodiments of the invention, it will be apparent to those skilled in the art that various changes and modifications can be made herein without departing from the scope of the invention.

What is claimed is:

1. A method for the controlled delivery of a vaporized chemical precursor to a low-pressure chemical vapor deposition reactor comprising the steps of:

providing a flow of liquid precursor containing a quantity of dissolved inert gas;

restricting said flow of liquid precursor;

separating said quantity of dissolved inert gas from said liquid precursor whereby a continuous flow of liquid precursor is produced;

vaporizing said continuous flow of liquid precursor; and delivering said vaporized precursor to said low-pressure chemical vapor deposition reactor.

2. The method of claim 1 wherein said separating is carried out in a gas/liquid separator into which additional inert gas other than the inert gas dissolved in the liquid precursor is introduced.

3. The method of claim 1 wherein the dissolved inert gas is separated from the liquid precursor in a conduit which connects a flow restrictor element used to effect said restricting and a vaporizer in which said vaporizing is carried out.

4. The method of claim 2 wherein the gas/liquid separator comprises a conduit which connects a flow restrictor element used to effect said restricting and an input of a vaporizer in which said vaporizing is carried out.

* * * * *